United States Patent
McCullen

(10) Patent No.: US 7,543,252 B2
(45) Date of Patent: Jun. 2, 2009

(54) MIGRATION OF INTEGRATED CIRCUIT LAYOUT FOR ALTERNATING PHASE SHIFT MASKS

(75) Inventor: Kevin W. McCullen, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 11/692,254

(22) Filed: Mar. 28, 2007

(65) Prior Publication Data

US 2008/0244494 A1 Oct. 2, 2008

(51) Int. Cl.
*G06F 17/50* (2006.01)

(52) U.S. Cl. ............... 716/2; 716/1; 716/3; 716/10; 716/14; 716/19; 716/20; 716/21; 430/5; 430/30

(58) Field of Classification Search ............... 716/1–3, 716/10, 14, 19–21; 430/5, 30
See application file for complete search history.

(56) References Cited

U.S. PATENT DOCUMENTS

| | | | |
|---|---|---|---|
| 5,375,069 A * | 12/1994 | Satoh et al. ............... 716/14 |
| 6,057,063 A | 5/2000 | Liebmann et al. |
| 6,698,008 B2 | 2/2004 | McCullen et al. |
| 6,757,886 B2 | 6/2004 | Liebmann et al. |
| 6,769,106 B2 * | 7/2004 | Hasegawa ............... 716/12 |
| 6,901,576 B2 | 5/2005 | Liebmann et al. |
| 6,957,414 B2 | 10/2005 | Ludwig et al. |
| 6,986,109 B2 | 1/2006 | Allen et al. |
| 2005/0287443 A1 | 12/2005 | McCullen |
| 2006/0085769 A1 | 4/2006 | Bergeron et al. |
| 2006/0101357 A1 | 5/2006 | Allen et al. |

OTHER PUBLICATIONS

Heng et al., "A VLSI Artwork Legalization Technique Based on a New Criterion of Minimum Layout Perturbation," ACM, Inc., Napa Valley, California, 1997, pp. 116-121.

(Continued)

*Primary Examiner*—Vuthe Siek
*Assistant Examiner*—Nghia M Doan
(74) *Attorney, Agent, or Firm*—Ryan K. Simmons; Hoffman Warnick LLC

(57) ABSTRACT

Method, system and program product for migrating an integrated circuit (IC) layout for, for example, alternating aperture phase shift masks (AltPSM), are disclosed. In order to migrate a layout to phase compliance, jogs are identified on a first (AltPSM) layer and shifted to another second layer. Isolated or clustered jogs are shifted into an open channel portions on the second layer where possible. Remaining clustered jogs are shifted into as few new channels as possible on the second layer. The jog removal process leaves unidirectional wires that can be trivially phase colored. Standard technology migration techniques are then used to legalize the results on the layers.

18 Claims, 6 Drawing Sheets

OTHER PUBLICATIONS

Heng et al., "Application of Automated Design Migration to Alternating Phase Shift Mask Design," ACM, Inc., Sonoma, California, 2001, pp. 38-43.

Lin et al., "Methodology for Automated Layout Migration for 90nm ItananiumR2 Processor Design," IEEE Computer Society, Jun. 2004, pp. 1-5.

Chiang et al., "Fast and Efficient Phase Conflict Detection and Correction in Standard-Cell Layouts," Computer-Aided Design, Nov. 2005, pp. 1-8.

Berman et al., "Optimal Phase Conflict Removal for Layout of Dark Field Alternating Phase Shifting Masks," International Symposium on Physical Design, 1999, pp. 121-126.

Kahng et al., "Automated Layout and Phase Assignment Techniques for Dark Field Alternating PSM," 18th Annual BACUS Symposium, 1998, pp. 1-10.

McCullen, "Phase Correct Routing For Alternating Phase Shift Masks," ACM, San Diego, California, Jun. 2004, pp. 317-320.

* cited by examiner

MIGRATION OF INTEGRATED CIRCUIT LAYOUT FOR ALTERNATING PHASE SHIFT MASKS

BACKGROUND OF THE INVENTION

1. Technical Field

The invention relates generally to integrated circuit design, and more particularly, to migrating an integrated circuit (IC) layout for, for example, alternating aperture phase shift masks (AltPSM) or gridded layouts.

2. Background Art

Integrated circuit (IC) chip layouts or designs are created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or Oasis) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Alternating aperture phase shift masks (AltPSM) are used extensively to print sub-wavelength features. The use of AltPSM in manufacturing creates topology restrictions in the design. AltPSM has been used primarily for printing the gate layer of chips, and may be required in future generations for routing layers. Gridded layouts have shapes on certain layers that are drawn predominantly or exclusively in one direction (i.e. a set of parallel lines of differing lengths). Migration of designs from one technology (size) generation to the next is increasingly important in order to minimize the cost in resources and time needed to get the next generation design to market. Unfortunately, no adequate techniques exist to migrate routing from general topologies to AltPSM restricted topologies.

SUMMARY OF THE INVENTION

Method, system and program product for migrating an integrated circuit (IC) layout for, for example, alternating aperture phase shift masks (AltPSM), are disclosed. In order to migrate a layout to phase compliance, jogs are identified on a first (AltPSM) layer and shifted to another second layer. Isolated or clustered jogs are shifted into open channel portions on the second layer where possible. Remaining jogs are shifted into as few new channels as possible on the second layer. The jog removal process leaves unidirectional wires that can be trivially phase colored. Standard technology migration techniques are then used to legalize the results on the layers.

A first aspect of the invention provides a method of migrating an integrated circuit (IC) layout, the method comprising: identifying all jogs in the layout in a first layer including any isolated jogs; identifying clusters of jogs in the first layer that have overlapping jog intervals and extents; first searching for a first open channel portion on the second layer for each of any isolated jogs and in which a respective isolated jog fits without conflict, and in the case that the first open channel portion exists in the second layer, shifting the respective isolated jog to the first open channel portion in the second layer; shifting the cluster of jogs by second searching for a maximal number of second open channel portions on the second layer that intersect each of the jogs intervals, but do not cause the jogs to collide, and first shifting each of the jogs that intersect a second open channel portion to the second layer, and, in the case that the second open channel portion does not exist for at least one remaining jog, determining a new channel on the second layer intersecting an interval of as many of the remaining jogs as possible, and second shifting the remaining jogs of the cluster that have intervals intersecting the new channel to the new channel on the second layer; phase coloring the first layer; and applying a technology migration technique to the first layer and the second layer. One embodiment of the new channel determining includes: a) sorting intervals of the remaining jogs by starting point; b) scanning the IC layout, maintaining a running total of a number of intervals currently active, and maintaining a maximum number of intervals active at any potential new channel position; c) at the maximum number of intervals active at any new channel position, assigning all of the remaining jogs of the cluster with intervals intersecting the new channel position to the new channel position; d) removing the assigned jogs and their intervals from consideration; and e) repeating b) to d) until no jogs remain to be assigned. The cluster of jogs shifting may include generating a conflict graph including a node for each open channel portion in the second layer and an arc indicating prohibited node relationships. In this case, the conflict graph generating may include: a) for each jog l, creating one node $N_{i1} \ldots N_{im}$ for every open channel portion in the second layer within the interval of the respective jog l, where m is the number of channels in the second layer; b) if the jog l and a jog j cannot occupy position y without a collision, then inserting an arc between a node $N_{iy}$ indicating a y-position of the jog l and a node $N_{jy}$ indicating a y-position of the jog j; and c) if the jog l must be to the left of the jog j, inserting an arc between all nodes $N_{iy}$ and $N_{jw}$ where y<w. Further, the first shifting may include: a) sorting the nodes in the conflict graph by increasing degree; b) selecting a lowest degree node $N_{ij}$ in the conflict graph; c) assigning a jog l to a location j; d) removing all arcs connected to the lowest degree node N and the nodes at the other end of the arcs associated with the lowest degree node $N_{ij}$; e) removing nodes $N_{i1} \ldots N_{im}$ from the conflict graph and removing all arcs connected to these nodes from the conflict graph, where m is a number of channels in the second layer; and f) if unassigned jogs remain, returning to step a). In one embodiment, the technology migration applying ensures that required end-to-end spacings are met on the first layer and wires on the second layer are spread to accommodate any jogs inserted between existing wires.

A second aspect of the invention provides a system for migrating a integrated circuit (IC) layout, the system comprising: a jog identifier for identifying all jogs in the layout in a first layer including any isolated jogs; a cluster identifier for identifying a cluster of jogs in the first layer that have overlapping jog intervals and extents; an open searcher for first searching for a first open channel portion on the second layer for each of any isolated jog and in which a respective isolated jog fits without conflict; a jog shifter for, in the case that the first open channel portion exists in the second layer, shifting the respective isolated jog to the first open channel portion in the second layer; a cluster shifter for shifting the cluster of jogs by second searching for a maximal number of second open channel portions on the second layer that intersect each of the jogs intervals, but do not cause the jogs to collide, and first shifting each of the jogs that intersect a second open channel portion to the second layer, and, in the case that the second open channel portion does not exist for at least one remaining jog, employing a channel inserter to determine a new channel on the second layer intersecting an interval of as many of the remaining jogs of the cluster as possible, and second shifting the remaining jogs of the cluster that have intervals intersecting the new channel to the new channel on the second layer; a phase coloring system for phase coloring the first layer; and a migration module for applying a technology migration technique to the first layer and the second layer.

A third aspect of the invention provides a program product stored on a computer readable medium for migrating an integrated circuit (IC) layout, the computer readable medium comprising program code, which when executed, performs: identifying all jogs in the layout in a first layer including any isolated jogs; identifying clusters of jogs in the first layer that have overlapping jog intervals and extents; first searching for a first open channel portion on the second layer for each of any isolated jogs and in which a respective isolated jog fits without conflict, and in the case that the first open channel portion exists in the second layer, shifting the respective isolated jog to the first open channel portion in the second layer; shifting the cluster of jogs by second searching for a maximal number of second open channel portions on the second layer that intersect each of the jogs intervals, but do not cause the jogs to collide, and first shifting each of the jogs that intersect a second open channel portion to the second layer, and, in the case that the second open channel portion does not exist for at least one remaining jog, determining a new channel on the second layer intersecting an interval of as many of the remaining jogs as possible, and second shifting the remaining jogs of the cluster that have intervals intersecting the new channel to the new channel on the second layer; phase coloring the first layer; and applying a technology migration technique to the first layer and the second layer.

A fourth aspect of the invention provides a computer-readable medium that includes computer program code to enable a computer infrastructure to migrate an integrated circuit (IC) layout, the computer-readable medium comprising computer program code for performing the method steps of the invention.

An fifth aspect of the invention provides a business method for migrating an integrated circuit (IC) layout, the business method comprising managing a computer infrastructure that performs each of the steps of the invention; and receiving payment based on the managing step.

A sixth aspect of the invention provides a method of generating a system for migrating an integrated circuit (IC) layout, the method comprising: obtaining a computer infrastructure; and deploying means for performing each of the steps of the invention to the computer infrastructure.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

I. Introduction and Definitions

Figure 1:
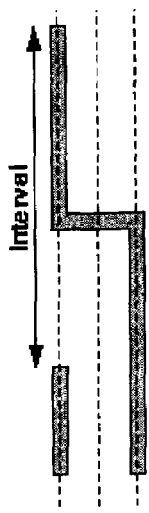
FIGS. 1-4 show various jogs according to embodiments of the invention.

In order to migrate an integrated circuit (IC) layout from, for example, a non-alternating phase shift masks layout (AltPSM) to an AltPSM layout with phase compliance, jogs on a first, AltPSM layer are identified and shifted to another, second layer. It is understood that while the invention is described relative to AltPSM setting, the teachings of the invention are not so limited. As shown in FIG. 1, a "jog" is a wire that shifts wiring channels, i.e., lines along which wires are laid, within a layer. That is, a segment of wire that does not extend in the preferred wiring direction for the layer in which it exists. Jogs are shifted to the second layer while minimizing the changes to the layout and the number of new wiring channels required. The jog removal process leaves unidirectional wires on the first layer that can be trivially phase colored. Standard technology migration techniques are then used to legalize the results on the layers.

In migrating an IC layout to, for example, dark field (DF) AltPSM compliance, it is necessary to grid the wires and maintain spacings that depend on the colors assigned to the wires. It is no longer sufficient to maintain a minimum spacing between two wires; the required spacing depends on the phase colors assigned to the wires. The wiring rules may require an empty wiring channel between all wires of the same color. These spacings apply for both side-to-side and end-to-end relationships.

"Preferred wiring direction" for a layer is the orientation (horizontal or vertical) of the majority of the wires on that wiring layer. In a gridded or AltPSM layout, the preferred wiring direction is mandated rather than being a preference.

"First layer" is the layer containing the wire that jogs from one channel to another. The first layer may be, for example, an AltPSM layout to be migrated to, for example, a DF AltPSM-correct topology.

"Second layer" is the wiring layer to which jogs will be shifted. The second layer is a layer that is parallel to the plane of the page of FIG. 1, i.e., it may be below the page or above the page.

Generally speaking, the first layer and second layer have preferred wiring directions that are orthogonal (one is vertical, the other horizontal).

"Jog interval" or "interval" is a distance along the preferred wiring direction that a jog can be moved without changing wire endpoints. In other words, it is the range of the wires attached to a jog, in the preferred wiring direction. As shown in FIG. 1, for a vertical jog, this is the distance between the lowest X and highest X of the horizontal wires attached to the jog. A jog interval is limited, as shown in FIG. 2, by any other wires that share channels with the non-jogged portion of the wire.

"Jog extent" or "extent" is the number of channels on the first layer (or distance) spanned by the jog. As shown in FIG. 1, for a vertical jog, this is the height of the jog.

Figure 2:
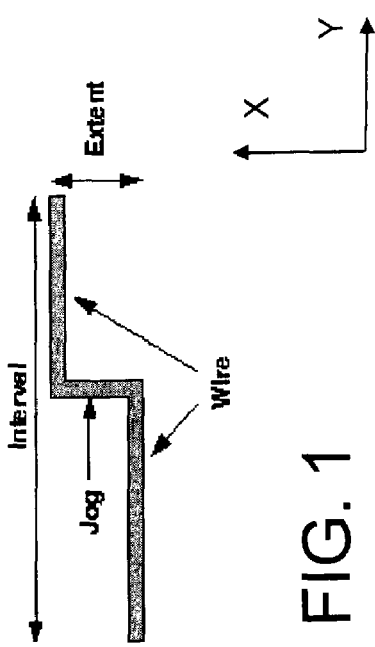

FIG. 1 and FIG. 2 show an "isolated jog," which interacts with no other jog. In this case, the jog can be shifted anywhere along the interval and maintain connection. As a result, so long as an open space exists in the second layer, the jog can be shifted to the second layer.

Figure 3:
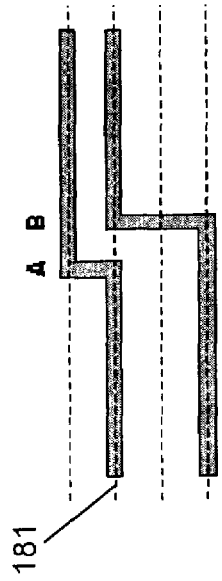

FIG. 3 shows two jogs that "interact" because their extents and intervals overlap. In this case, the jogs cannot be shifted independently within the intervals of the respective jogs because they may overlap. As a result, if, for example, an open space exists in the second layer for the jog of wire A, it may be shifted to the second layer. However, the jog of wire B cannot then be shifted to the second layer at the same location.

Figure 4:
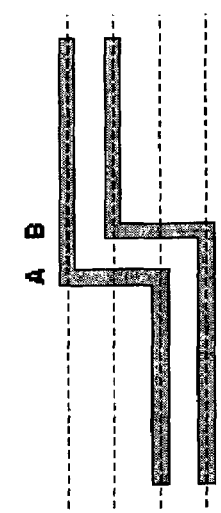

FIG. 4 shows two jogs that are "coincident." Two jogs are coincident if and only if they interact and a wire attached to one jog is in the same channel (horizontal or vertical) as a wire attached to the other jog. If two jogging wires share a wiring channel in this way, there is a left to right relationship that must be maintained between the jogs in order to avoid creating an electrical short between the wires.

A "cluster" is a group of jogs with mutually overlapping intervals and extents. A cluster may contain jogs that are coincident as in FIG. 4 or that overlap without being coincident, as in FIG. 3. All of the jogs in a cluster must be placed taking into consideration the placements of the other jogs in the cluster.

II. System Overview

Figure 5:
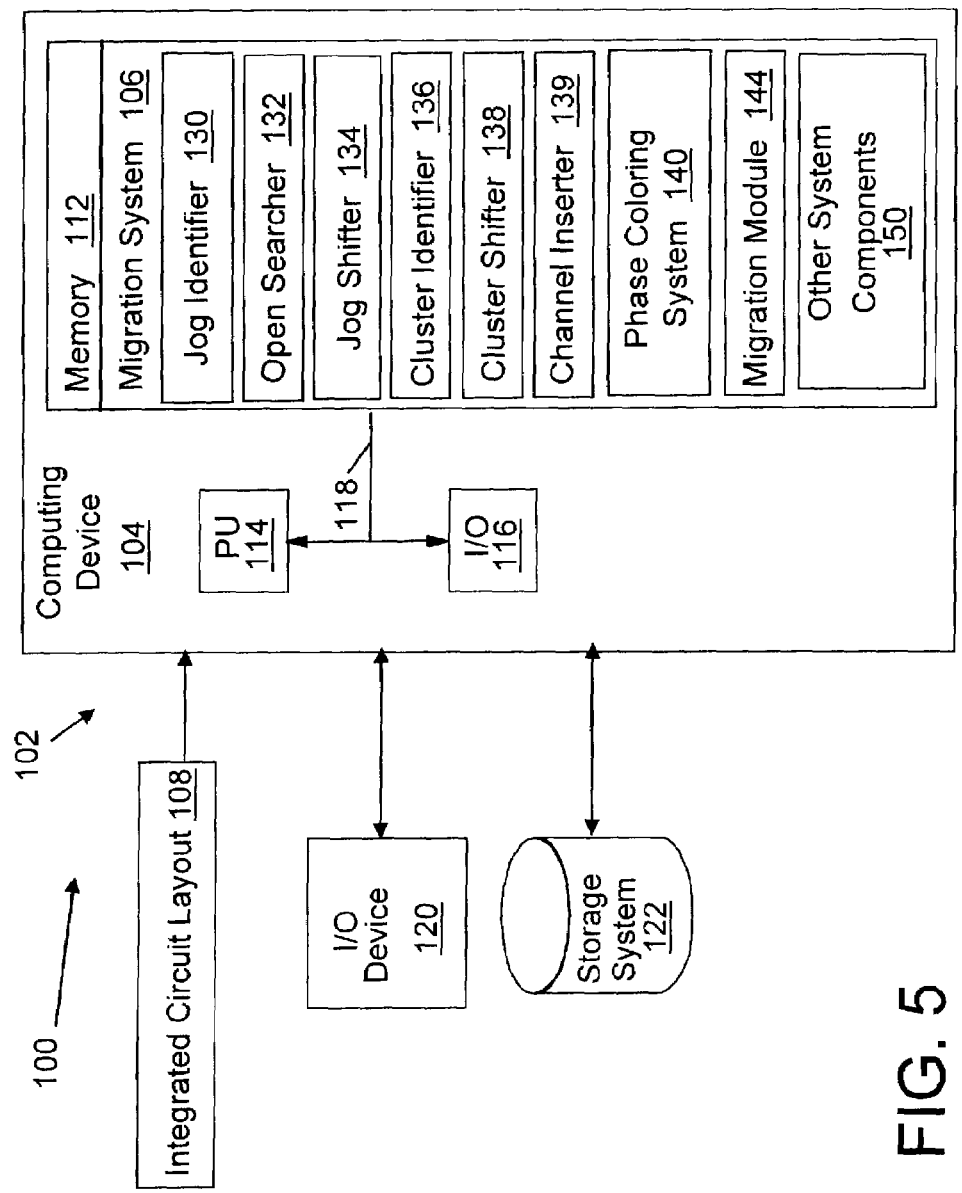
FIG. 5 shows a block diagram of a system according to one embodiment of the invention.

FIG. 5 shows an illustrative environment 100 for technology migration. To this extent, environment 100 includes a computer infrastructure 102 that can perform the various process steps described herein for technology migration. In particular, computer infrastructure 102 is shown including a computing device 104 that comprises a migration system 106, which enables computing device 104 to migrate an IC layout 108 (FIG. 5) by performing the process steps of the invention.

Computing device 104 is shown including a memory 112, a processor (PU) 114, an input/output (I/O) interface 116, and a bus 118. Further, computing device 104 is shown in communication with an external I/O device/resource 120 and a storage system 122. As is known in the art, in general, processor 114 executes computer program code, such as migration system 106, that is stored in memory 112 and/or storage system 122. While executing computer program code, processor 114 can read and/or write data to/from memory 112, storage system 122, and/or I/O interface 116. Bus 118 provides a communications link between each of the components in computing device 104. I/O device 116 can comprise any device that enables a user to interact with computing device 104 or any device that enables computing device 104 to communicate with one or more other computing devices. Input/output devices (including but not limited to keyboards, displays, pointing devices, etc.) can be coupled to the system either directly or through intervening I/O controllers.

In any event, computing device 104 can comprise any general purpose computing article of manufacture capable of executing computer program code installed by a user (e.g., a personal computer, server, handheld device, etc.). However, it is understood that computing device 104 and migration system 106 are only representative of various possible equivalent computing devices that may perform the various process steps of the invention. To this extent, in other embodiments, computing device 104 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 102 is only illustrative of various types of computer infrastructures for implementing the invention. For example, in one embodiment, computer infrastructure 102 comprises two or more computing devices (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Network adapters may also be coupled to the system to enable the data processing system to become coupled to other data processing systems or remote printers or storage devices through intervening private or public networks. Modems, cable modem and Ethernet cards are just a few of the currently available types of network adapters. Regardless, communications between the computing devices may utilize any combination of various types of transmission techniques.

As previously mentioned and discussed further below, migration system 106 enables computing infrastructure 102 to migrate an IC layout 108 (FIG. 5). To this extent, migration system 106 is shown includes a jog identifier 130, an open searcher 132, a jog shifter 134, a cluster identifier 136, a cluster shifter 138, a channel inserter 139, a phase coloring system 140, a migration module 142 and other system components 150. Operation of each of these systems is discussed further below. However, it is understood that some of the various systems shown in FIG. 1 can be implemented independently, combined, and/or stored in memory for one or more separate computing devices that are included in computer infrastructure 102. Further, it is understood that some of the systems and/or functionality may not be implemented, or additional systems and/or functionality may be included as part of environment 100.

III. Operational Methodology

Figure 6:
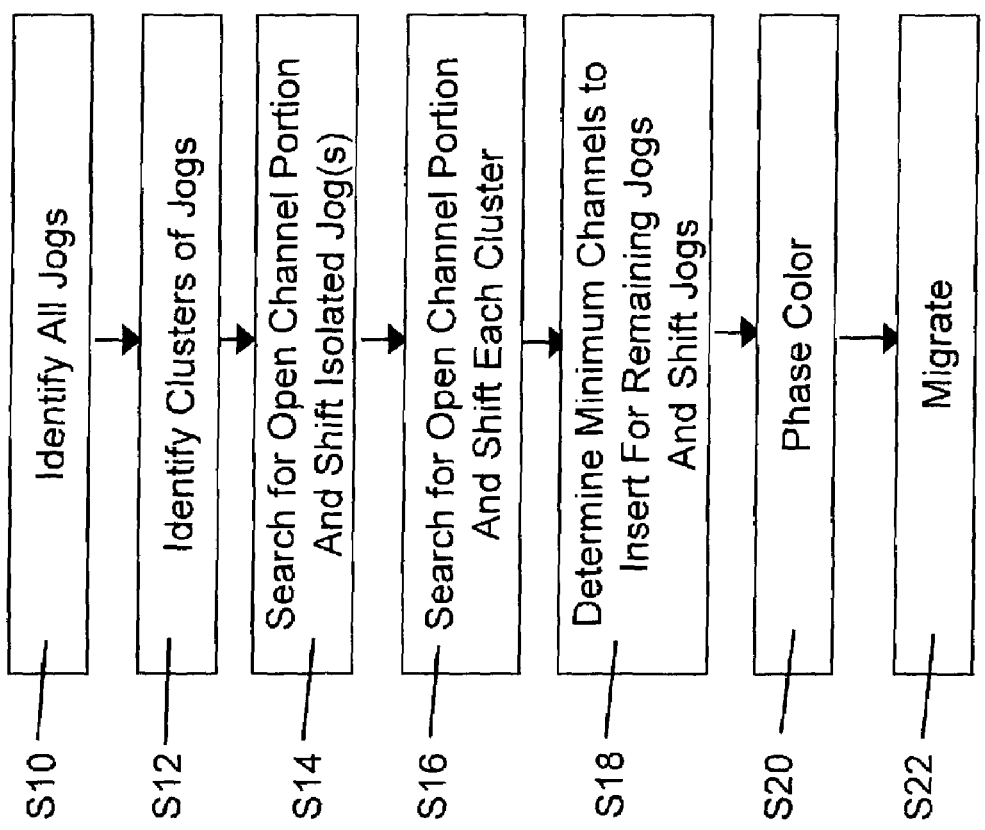
FIG. 6 shows a flow diagram of one embodiment of operation of the system of FIG. 5 according to the invention.
Figure 7:
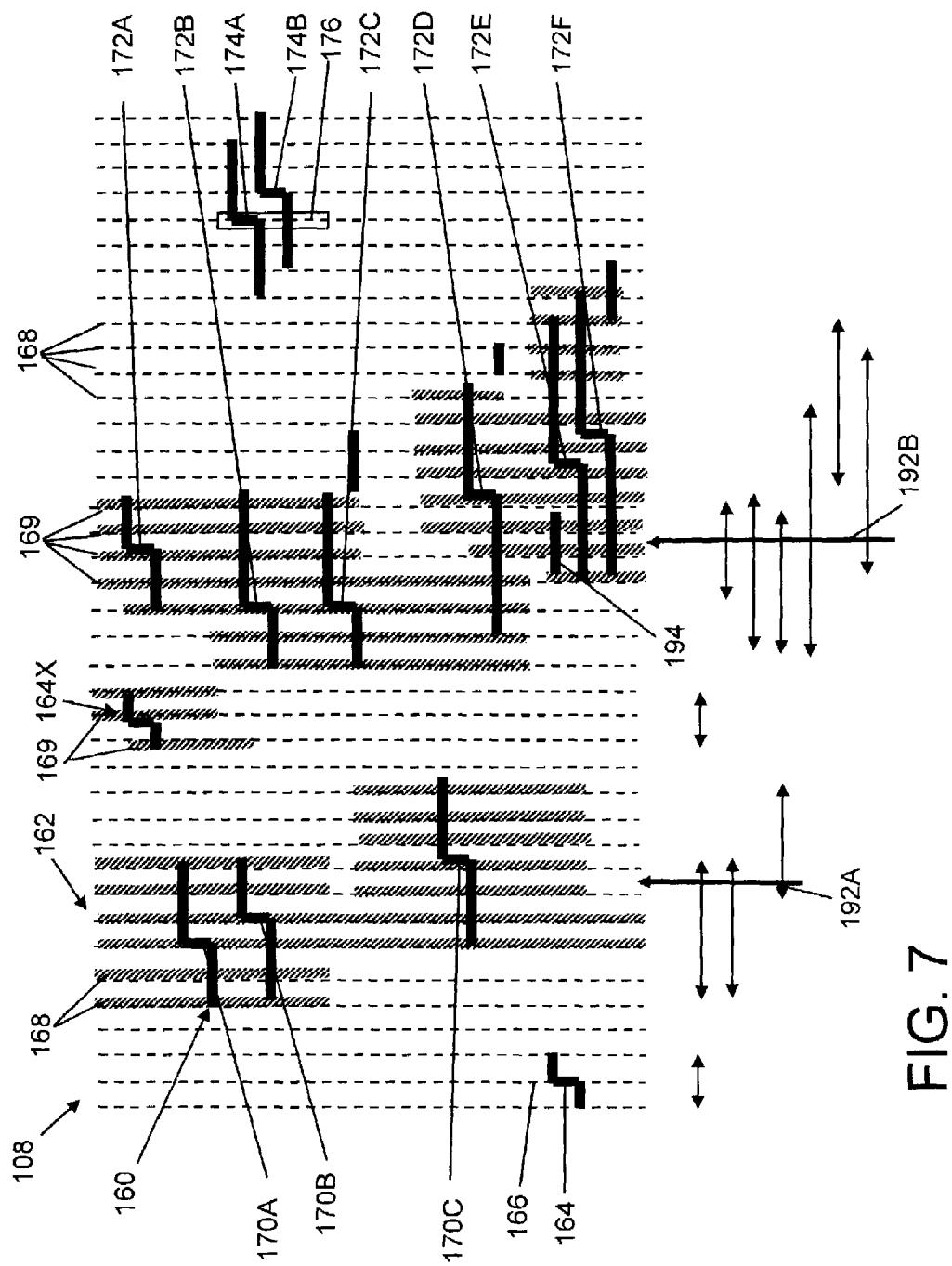
FIG. 7 shows an illustrative integrated circuit (IC) layout.
Figure 8:
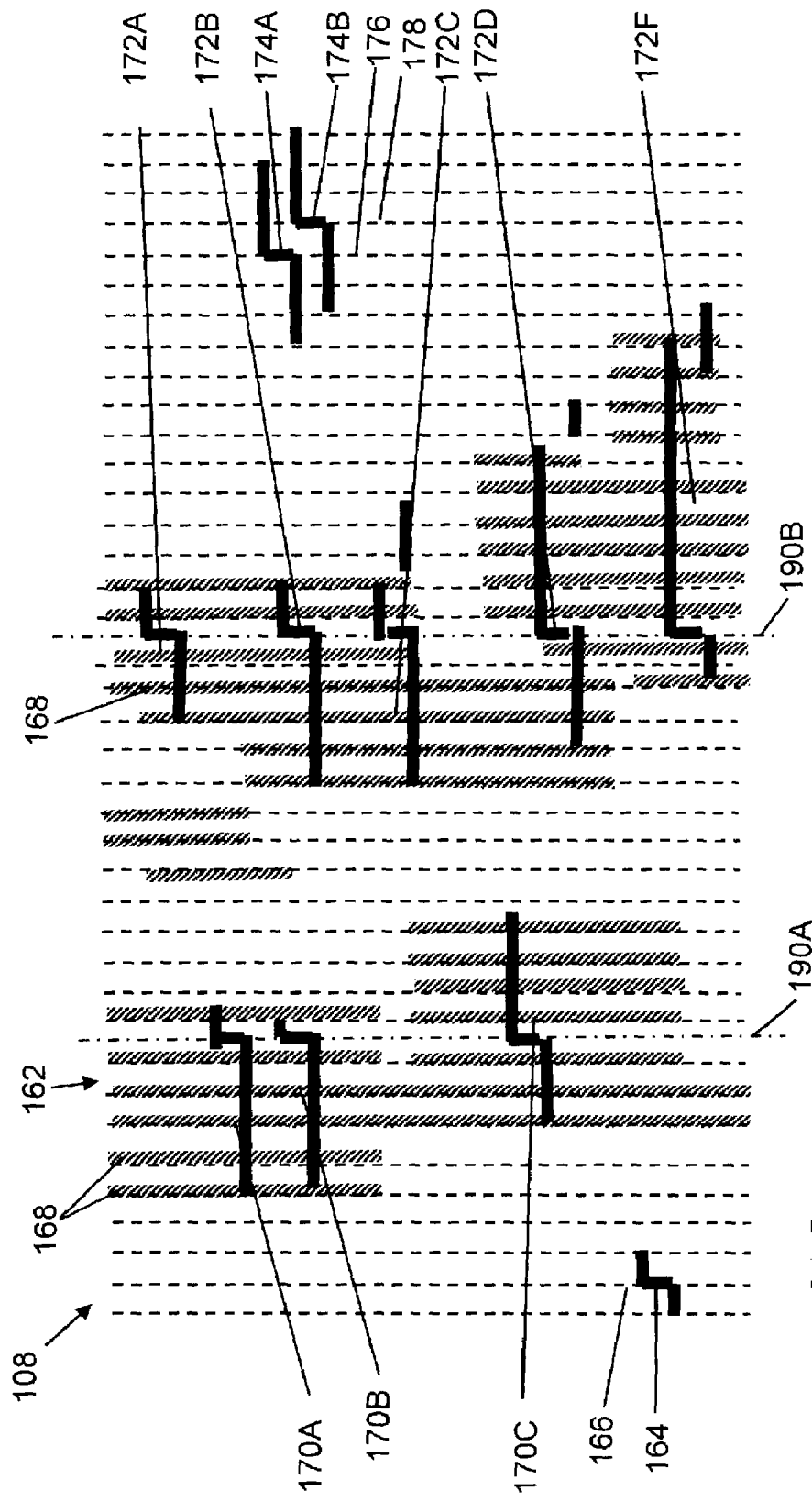
FIG. 8 shows an illustrative IC layout with shifted jogs according to one embodiment of the invention.

One embodiment of an operational methodology will now be described relative to FIG. 5 in conjunction with a flow diagram illustrated in FIG. 6 and an illustrative IC layout 108 shown in FIGS. 7-8. It is understood that IC layout 108 is only illustrative and the layout may include any form of IC. FIG. 7 shows IC layout 108 including a first layer 160 superimposed on a second layer 162, with FIG. 8 showing only second layer 162 with IC layout 108 after jog and cluster shifting including new channels 190A-B. In FIG. 7, wiring in first layer 160 is shown in black, solid lines and generally runs horizontally on the page except for the jogs, and wiring channels 168 in second layer 162 are shown in dashed lines with wiring 169 therein shown in cross-hatched lines and run vertically on the page. In FIG. 8, wiring shifted from first layer 160 is shown in black, and original wiring 169 is shown in cross-hatched lines along wiring channels 168 in dashed lines. Intervals of each jog are shown by double arrows below the grid of IC layout 108 in FIG. 7.

In S10, jog identifier 130 identifies all jogs in IC layout 108 in first layer 160, including any isolated jog 164, 164X. Note, in some instances, there may not be any isolated jogs 164, 164X. Jog identifier 130 may include any now known or later developed technique to identify the isolated jogs, e.g., scan line processing. In one example, each wire is checked one at a time to identify: a) a rectangle that is oriented in the wrong direction (i.e., not the preferred wiring direction for first layer 160), b) a polygon that contains a segment that is oriented in the wrong direction, or c) a polywire (also called a line, or a path) that has a segment oriented in the wrong direction. Each of these above-mentioned cases creates a jog. Other techniques may also be employed. Although few isolated jogs 164, 164X are shown, it is understood that IC layout 108 may include any number of isolated jogs 164.

In S12, cluster identifier 136 identifies a cluster of jogs 172E-F, 174A-B in first layer 160 that have overlapping jog intervals and extents (see FIGS. 3-4). Jogs that interact as shown in FIG. 3, i.e., with overlapping intervals and extents, cannot be assigned to the same channel on second layer 162. Jogs that are coincident, as shown in FIG. 4 (i.e., have ends in the same wiring channel on first layer 160), must maintain a left to right relationship (if jog A is left of jog B on first layer 160, then A must be left of B on second layer 162).

In S14, open searcher 132 searches for a first open channel portion 166 on second layer 162 for each isolated jog 164, 164X in which isolated jog 164, 164X fits without conflict. Note, again, if no isolated jogs 164, 164X are identified, this step may be omitted. Open searcher 132 may include any now known or later developed search technique, e.g., scan line processing. As indicated, an open channel portion 166 exists over isolated jog 164. That is, no wiring 169 in a wiring channel 168 on second layer 162 conflicts with isolated jog 164. Open searcher 132 also considers different locations for jog 164 along it's own interval if a conflict exists. Thus, some wiring channels 168 conflicting with isolated jog 164 would be handled by open searcher 132. Also in S14, in the case that open channel portion 166 exists (i.e., is over jog 164, 164X or somewhere along it's interval) in second layer 162, jog shifter 134 shifts the respective isolated jog 164 to first open channel portion 166 in second layer 162. That is, isolated jog 164 is shifted from being in first layer 160 to being in second layer 162 in the layout. The shifting may be repeated for each isolated jog 164. It is understood, that not all isolated jogs may be handled in the above manner and must remain on first layer 160. For example, isolated jog 164X does not have any location along its interval in which it does not conflict with wiring 169 of second layer 162.

Figure 9:
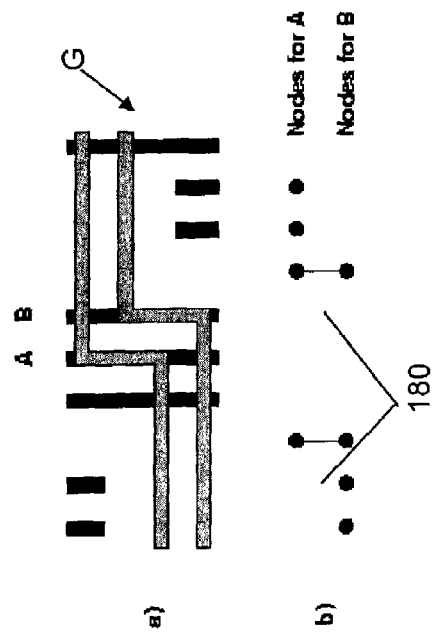
FIG. 9 shows illustrative jogs with shifting of jogs according to one embodiment of the invention.

In S16-S18, cluster shifter 138 shifts clusters of jogs to second layer 162. In S16, cluster shifter 138 searches for a maximal number of second open channel portions on second layer 162 that intersect each of the jog intervals of a cluster 172E-F and/or 174A-B, but do not cause the jogs to collide. Also in S16, cluster shifter 138 shifts the jogs of cluster 174A-B that intersect the open channel portion 180, 182 to second layer 162. S16 processes may occur in a number of ways. Shifting clustered jogs requires finding a maximum number of jogs within a cluster 172E-F and/or 174A-B that can be simultaneously shifted from first layer 160 to second layer 162, while not creating any wire collisions between the wires making up the cluster. FIG. 9 shows in a lower part thereof, jogs A, B in a cluster, as in FIG. 3, shifted to second layer 162. As shown in FIG. 9, jogs A, B in a cluster can pass each other to find open channels on second layer 162. In the case shown, jogs A and B can pass each other without creating a short. This differs from the situation shown in FIG. 4, where the two jogging wires share a wiring channel 181 and cannot be allowed to pass each other.

In one embodiment, this process may include cluster shifter 138 generating a conflict graph G of the cluster of jogs and using the graph to identify any second open channel portions 176, 178 (FIG. 8) via a heuristic process. A conflict graph G for a jog cluster is a graph that contains a node for every legal jog location, and an arc connecting every pair of jog locations that cannot be occupied simultaneously. Stated another way, a conflict graph includes a node for each open channel portion in second layer 162 and an arc indicating prohibited node relationships. A conflict graph G may be generated by cluster shifter 138 as follows: a) for each jog i, create one node $N_{i1} \ldots N_{im}$ for every open channel portion 176, 178 in second layer 162 within the interval of the respective jog i, where m is the number of channels in the second layer; b) if the jog i and a jog j cannot occupy position y without a collision, then insert an arc between a node $N_{iy}$ indicating a y-position of the jog i and a node $N_{jy}$ indicating a y-position of the jog j; and c) if the jog i must be to the left of the jog j, insert an arc between all nodes $N_{iy}$ and $N_{jw}$ where y<w.

Figure 10:
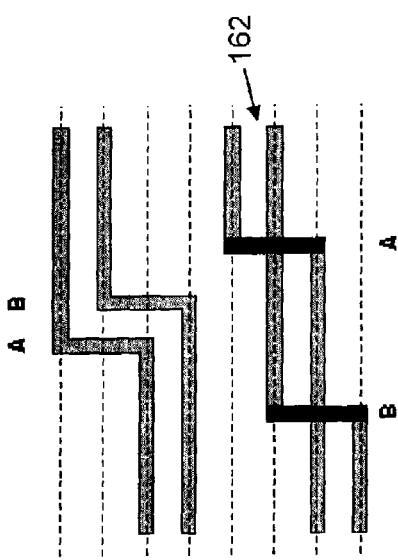
FIGS. 10-11 show illustrative conflict graphs according to embodiments of the invention.
Figure 11:
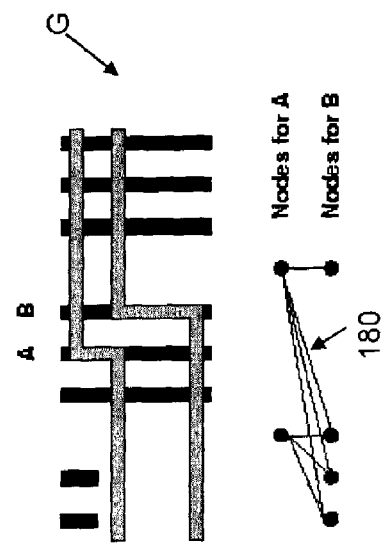

FIG. 10 shows an illustrative conflict graph for the cluster of jogs shown in FIG. 3, and the upper part of FIG. 9. Arcs 180 are shown in the lower part of FIG. 10, and indicate where two jogs will overlap and create a wire short, i.e., via step b) of the conflict graph generation. FIG. 11 shows an illustrative conflict graph for the jogs of FIG. 3. In this case, pair of jogs A, B includes a left to right constraint caused by a shared wiring channel on first layer 160 (FIG. 7). In this case, step c) of the conflict graph generation inserts arcs 180 from each node for jog A to all of the nodes for jog B that are below or to the left.

In one embodiment, the heuristic for shifting clustered jogs using conflict graph G is as follows: a) sorting the nodes in the conflict graph by increasing degree; b) selecting a lowest degree node $N_{ij}$ in the conflict graph; c) assigning a jog i to a location j; d) removing all arcs connected to the lowest degree node $N_{ij}$ and the nodes at the other end of the arcs associated with the lowest degree node $N_{ij}$; e) removing nodes $N_{i1} \ldots N_{im}$ from the conflict graph and removing all arcs connected to these nodes from the conflict graph, where m is a number of channels in second layer 162; and f) if unassigned jogs remain, returning to step a). Other processes using a conflict graph may also be possible within the scope of the invention. In any event, in the example shown in FIG. 8, cluster shifter 138 shifts jogs 174A, 174B to open channel portion 176, 178 on second layer 162 where an open channel portion exists.

Referring to FIG. 8, in the case that a second open channel portion does not exist for at least one remaining jog, e.g., as with jog clusters 172E-F, at S18, cluster shifter 138 employs channel inserter 139 to determine a new channel 190A-B on second layer 162 intersecting an interval of as many of the remaining jogs of cluster 172E-F as possible. That is, once isolated jogs 164 and clustered jogs that can be shifted have been shifted to second layer 162, the remaining jogs are those that have no second layer 162 open channel portion 168 within their extent or that have conflicts within a cluster that prevent them from reaching an open channel portion of second layer 162. These jogs will require additional channels 168 to be added/inserted to second layer 162 by channel inserter 139. Adding channels to second layer 162 is done by inserting these jogs between existing second layer 162 wires 169. Since the existing second layer 162 wires 169 are at minimum spacing already, this situation creates a legalization problem for the migration at S22 that follows (spreading second layer 162 wires to make space).

As shown in FIG. 7, the determining may include determining a location, indicated by arrows 192A-B, of the new channel by where a largest number of intervals of the cluster intersect. This process minimizes the number of new channels 168 required. Two new channels 190A-B are shown in FIG. 8, and require spreading existing second layer 162 wires 169 to accommodate the shifted jogs. New channel 190A intersects each of the intervals of jogs 170A-C, as shown by the arrow 190A in the bottom of FIG. 7. New channel 190B intersects each of the intervals of jogs 172A-D and 172F. As shown in FIG. 7, jog 172E is incapable of shifting because of intervening wire 194. Also at S18, cluster shifter 138 shifts jogs 170A-C, 172A-D, 172F of the cluster that have intervals intersecting new channel 190A, 190B, respectively to new channel 190A, 190B on second layer 162.

In one embodiment, the determining by channel inserter 139 at S18 may employ a heuristic as follows: a) sorting intervals of the jogs by starting point (e.g., from left to right or top to bottom depending on the predominate wiring direction); b) scanning IC layout 108, maintaining a running total of a number of intervals currently active, and maintaining a maximum number of intervals active at any potential new channel position; c) at the maximum number of intervals active at any new channel position (as shown by arrows 190A-B in FIG. 7), assigning all of the jogs of the cluster with intervals intersecting the new channel position to the new channel position (e.g., jogs 170A-C and 172A-D, F to new channels 192A-B in FIG. 8); d) removing the assigned jogs and their intervals from consideration; e) repeating b) to d) until no jogs remain to be assigned. Other processes of determining positions of a new channel 192A-B may also be employed within the scope of the invention.

At S20, phase coloring system 140 performs phase coloring of first layer 160 in any now known or later developed manner.

At S22, migration module 144 applies a technology migration technique to first layer 160 and second layer 162 to finalize the migration. In one embodiment, technology migration applying ensures that required end-to-end spacings are met on first layer 160 and wires on second layer 162 are spread to accommodate any jogs inserted between existing wires.

IV. Conclusion

As discussed herein, various systems and components are described as "obtaining" data (e.g., IC layout 108, etc.). It is understood that the corresponding data can be obtained using any solution. For example, the corresponding system/component can generate and/or be used to generate the data, retrieve the data from one or more data stores (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

While shown and described herein as a method and system for migrate an IC layout 108 (FIG. 7), it is understood that the invention further provides various alternative embodiments. That is, the invention can take the form of an entirely hardware embodiment, an entirely software embodiment or an embodiment containing both hardware and software elements. In a preferred embodiment, the invention is implemented in software, which includes but is not limited to firmware, resident software, microcode, etc. In one embodiment, the invention can take the form of a computer program product accessible from a computer-usable or computer-readable medium providing program code for use by or in connection with a computer or any instruction execution system, which when executed, enables a computer infrastructure to migrate an IC layout 108 (FIG. 7). For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, such as storage system 122, magnetic tape, a removable computer diskette, a random access memory (RAM), a read-only memory (ROM), a tape, a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processing unit 114 coupled directly or indirectly to memory elements through a system bus 118. The memory elements can include local memory, e.g., memory 112, employed during actual execution of the program code, bulk storage (e.g., memory system 122), and cache memories which provide temporary storage of at least some program code in order to reduce the number of times code must be retrieved from bulk storage during execution.

In another embodiment, the invention provides a method of generating a system for migrate an IC layout 108 (FIG. 7). In this case, a computer infrastructure, such as computer infrastructure 102 (FIG. 5), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing device 104 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the invention.

In still another embodiment, the invention provides a method that performs the process described herein on a subscription, advertising, and/or fee basis. That is, a service provider, such as an application service provider, could offer to migrate an IC layout 108 (FIG. 7), as described herein. In this case, the service provider can manage (e.g., create, maintain, support, etc.) a computer infrastructure, such as computer infrastructure 102 (FIG. 5), that performs the process described herein for one or more customers. In return, the service provider can receive payment from the customer(s) under a subscription and/or fee agreement, receive payment from the sale of advertising to one or more third parties, and/or the like.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of migrating an integrated circuit (IC) layout, the method comprising:
   identifying all jogs in the layout in a first layer including any isolated jogs;
   identifying clusters of jogs in the first layer that have overlapping jog intervals and extents;
   first searching for a first open channel portion on the second layer for each of any isolated jogs and in which a respective isolated jog fits without conflict, and, in the case that the first open channel portion exists in the second layer, shifting the respective isolated jog to the first open channel portion in the second layer;
   shifting the cluster of jogs by second searching for a maximal number of second open channel portions on the second layer that intersect each of the jogs intervals, but do not cause the jogs to collide, and
      first shifting each of the jogs that intersect a second open channel portion to the second layer, and,
      in the case that the second open channel portion does not exist for at least one remaining jog, determining a new channel on the second layer intersecting an interval of as many of the remaining jogs as possible, and
      second shifting the remaining jogs of the cluster that have intervals intersecting the new channel to the new channel on the second layer;
   phase coloring the first layer; and
   applying a technology migration technique to the first layer and the second layer.

2. The method of claim 1, wherein the new channel determining includes:
   a) sorting intervals of the remaining jogs by a starting point;
   b) scanning the IC layout, maintaining a running total of a number of intervals currently active, and maintaining a maximum number of intervals active at any potential new channel position;
   c) at the maximum number of intervals active at any new channel position, assigning all of the remaining jogs of the cluster with intervals intersecting the new channel position to the new channel position;
   d) removing the assigned jogs and their intervals from consideration; and
   e) repeating b) to d) until no jogs remain to be assigned.

3. The method of claim 1, wherein the cluster of jogs shifting includes generating a conflict graph including a node for each open channel portion in the second layer and an arc indicating prohibited node relationships.

4. The method of claim 3, wherein the conflict graph generating includes:
   a) for each jog l, creating one node $N_{i1} \ldots N_{im}$ for every open channel portion in the second layer within the interval of the respective jog l, where m is the number of channels in the second layer;
   b) if the jog l and a jog j cannot occupy position y without a collision, then inserting an arc between a node $N_{iy}$ indicating a y-position of the jog l and a node $N_{jy}$ indicating a y-position of the jog j; and
   c) if the jog l must be to the left of the jog j, inserting an arc between all nodes $N_{iy}$ and $N_{jw}$ where y<w.

5. The method of claim 3, wherein the first shifting includes:
   a) sorting the nodes in the conflict graph by increasing degree;
   b) selecting a lowest degree node $N_{ij}$ in the conflict graph;
   c) assigning a jog l to a location j;
   d) removing all arcs connected to the lowest degree node $N_{ij}$ and the nodes at the other end of the arcs associated with the lowest degree node $N_{ij}$;
   e) removing nodes $N_{i1} \ldots N_{im}$ from the conflict graph and removing all arcs connected to these nodes from the conflict graph, where m is a number of channels in the second layer; and
   f) if unassigned jogs remain, returning to step a).

6. The method of claim 1, wherein the technology migration applying ensures that required end-to-end spacings are met on the first layer and wires on the second layer are spread to accommodate any jogs inserted between existing wires.

7. A system for migrating a integrated circuit (IC) layout, the system comprising:
   a jog identifier for identifying all jogs in the layout in a first layer including any isolated jogs;
   a cluster identifier for identifying a cluster of jogs in the first layer that have overlapping jog intervals and extents;
   an open searcher for first searching for a first open channel portion on the second layer for each of any isolated jog and in which a respective isolated jog fits without conflict;
   a jog shifter for, in the case that the first open channel portion exists in the second layer, shifting the respective isolated jog to the first open channel portion in the second layer;
   a cluster shifter for shifting the cluster of jogs by second searching for a maximal number of second open channel portions on the second layer that intersect each of the jogs intervals, but do not cause the jogs to collide, and
      first shifting each of the jogs that intersect a second open channel portion to the second layer, and,
      in the case that the second open channel portion does not exist for at least one remaining jog, employing a channel inserter to determine a new channel on the second layer intersecting an interval of as many of the remaining jogs of the cluster as possible, and
      second shifting the remaining jogs of the cluster that have intervals intersecting the new channel to the new channel on the second layer;
   a phase coloring system for phase coloring the first layer; and
   a migration module for applying a technology migration technique to the first layer and the second layer.

8. The system of claim 7, wherein the cluster shifter determining includes:
   a) sorting intervals of the remaining jogs by starting point;
   b) scanning the IC layout, maintaining a running total of a number of intervals currently active, and maintaining a maximum number of intervals active at any potential new channel position;
   c) at the maximum number of intervals active at any new channel position, assigning all of the remaining jogs of the cluster with intervals intersecting the new channel position to the new channel position;
   d) removing the assigned jogs and their intervals from consideration;
   e) repeating b) to d) until no jogs remain to be assigned.

9. The system of claim 7, wherein the cluster of jogs shifter generates a conflict graph including a node for each open channel portion in the second layer and an arc indicating prohibited node relationships.

10. The system of claim 9, wherein the conflict graph generating of the cluster shifter includes:
 a) for each jog i, creating one node $N_{i1} \ldots N_{im}$ for every open channel portion in the second layer within the interval of the respective jog i, where m is the number of channels in the second layer;
 b) if the jog i and a jog j cannot occupy position y without a collision, then inserting an arc between a node $N_{iy}$ indicating a y-position of the jog i and a node $N_{jy}$ indicating a y-position of the jog j; and
 c) if the jog i must be to the left of the jog j, inserting an arc between all nodes $N_{iy}$ and $N_{jw}$ where y<w.

11. The system of claim 9, wherein the first shifting of the cluster shifter includes:
 a) sorting the nodes in the conflict graph by increasing degree;
 b) selecting a lowest degree node $N_{ij}$ in the conflict graph;
 c) assigning a jog i to a location j;
 d) removing all arcs connected to the lowest degree node $N_{ij}$ and the nodes at the other end of the arcs associated with the lowest degree node $N_{ij}$;
 e) removing nodes $N_{i1} \ldots N_{im}$ from the conflict graph and removing all arcs connected to these nodes from the conflict graph, where m is a number of channels in the second layer; and
 f) if unassigned jogs remain, returning to step a).

12. The system of claim 7, wherein the technology migration module ensures that required end-to-end spacings are met on the first layer and wires on the second layer are spread to accommodate any jogs inserted between existing wires.

13. A program product stored on a computer readable medium for migrating an integrated circuit (IC) layout, the computer readable medium comprising program code, which when executed, performs:
 identifying all jogs in the layout in a first layer including any isolated jogs;
 identifying clusters of jogs in the first layer that have overlapping jog intervals and extents;
 first searching for a first open channel portion on the second layer for each of any isolated jogs and in which a respective isolated jog fits without conflict, and in the case that the first open channel portion exists in the second layer, shifting the respective isolated jog to the first open channel portion in the second layer;
 shifting the cluster of jogs by second searching for a maximal number of second open channel portions on the second layer that intersect each of the jogs intervals, but do not cause the jogs to collide, and
  first shifting each of the jogs that intersect a second open channel portion to the second layer, and,
  in the case that the second open channel portion does not exist for at least one remaining jog, determining a new channel on the second layer intersecting an interval of as many of the remaining jogs as possible, and
  second shifting the remaining jogs of the cluster that have intervals intersecting the new channel to the new channel on the second layer;
 phase coloring the first layer; and
 applying a technology migration technique to the first layer and the second layer.

14. The program product of claim 13, wherein the new channel determining includes:
 a) sorting intervals of the remaining jogs by a starting point;
 b) scanning the IC layout, maintaining a running total of a number of intervals currently active, and maintaining a maximum number of intervals active at any potential new channel position;
 c) at the maximum number of intervals active at any new channel position, assigning all of the remaining jogs of the cluster with intervals intersecting the new channel position to the new channel position;
 d) removing the assigned jogs and their intervals from consideration;
 e) repeating b) to d) until no jogs remain to be assigned.

15. The program product of claim 13, wherein the cluster of jogs shifting includes generating a conflict graph including a node for each open channel portion in the second layer and an arc indicating prohibited node relationships.

16. The program product of claim 15, wherein the conflict graph generating includes:
 a) for each jog i, creating one node $N_{i1} \ldots N_{im}$ for every open channel portion in the second layer within the interval of the respective jog i, where m is the number of channels in the second layer;
 b) if the jog i and a jog j cannot occupy position y without a collision, then inserting an arc between a node $N_{iy}$ indicating a y-position of the jog i and a node $N_{jy}$ indicating a y-position of the jog j; and
 c) if the jog i must be to the left of the jog j, inserting an arc between all nodes $N_{iy}$ and $N_{jw}$ where y<w.

17. The program product of claim 15, wherein the first shifting includes:
 a) sorting the nodes in the conflict graph by increasing degree;
 b) selecting a lowest degree node $N_{ij}$ in the conflict graph;
 c) assigning a jog i to a location j;
 d) removing all arcs connected to the lowest degree node $N_{ij}$ and the nodes at the other end of the arcs associated with the lowest degree node $N_{ij}$;
 e) removing nodes $N_{i1} \ldots N_{im}$ from the conflict graph and removing all arcs connected to these nodes from the conflict graph, where m is a number of channels in the second layer; and
 f) if unassigned jogs remain, returning to step a).

18. The program product of claim 13, wherein the technology migration applying ensures that required end-to-end spacings are met on the first layer and wires on the second layer are spread to accommodate any jogs inserted between existing wires.

* * * * *